United States Patent [19]

Bergemont

[11] Patent Number: 5,047,362
[45] Date of Patent: Sep. 10, 1991

[54] METHOD OF MAKING LARGE-SCALE EPROM MEMORY WITH A CHECKER BOARD PATTERN AND AN IMPROVED COUPLING FACTOR

[75] Inventor: Albert Bergemont, La Tronche, France

[73] Assignee: SGS-Thomson Microelectronics S.A., Gentilly, France

[21] Appl. No.: 392,699

[22] Filed: Aug. 11, 1989

[30] Foreign Application Priority Data

Aug. 11, 1988 [FR] France ................... 88 10964

[51] Int. Cl.$^5$ ........................... H01L 21/70
[52] U.S. Cl. ........................ 437/52; 437/43; 437/48; 437/49; 437/51; 437/195; 437/228; 437/233; 357/23.5
[58] Field of Search ............ 437/43, 51, 52, 195, 437/228, 48, 49, 233; 357/23.5; 365/189

[56] References Cited

U.S. PATENT DOCUMENTS

| | | | |
|---|---|---|---|
| 3,893,152 | 7/1975 | Lin | 357/23.11 |
| 4,267,632 | 5/1981 | Shappin | 437/43 |
| 4,518,629 | 5/1985 | Jeuch | 437/228 |
| 4,527,258 | 7/1985 | Guterman | 357/23.5 |
| 4,713,142 | 12/1987 | Mitchell et al. | 437/228 |
| 4,808,261 | 2/1989 | Ghidini et al. | 357/23.5 |
| 4,849,369 | 7/1989 | Jeuch et al. | 437/43 |
| 4,851,365 | 7/1989 | Jeuch | 439/43 |
| 4,887,238 | 12/1989 | Bengemont | 357/23.11 |

FOREIGN PATENT DOCUMENTS 0050667 4/1980 Japan ................... 437/43
58-78467(A) 5/1983 Japan .

*Primary Examiner*—Brian E. Hearn
*Assistant Examiner*—T. Thomas
*Attorney, Agent, or Firm*—Lowe, Price, LeBlanc and Becker

[57] ABSTRACT

An electrically programmable non-volatile memory comprises word lines (LM2) extending along rows, and bit lines (LB1) extending along columns. Each memory point (PM1) is constituted by a pair of MOS transistors (T22, T23) having a floating gate (23). A conductive area (25) is connected to the floating gates (23) of the two transistors (T22, T23) of each pair and is in register with the word line (LM2) connected to the memory point (PM1) made by the transistor pair. This word line (LM2) corresponds, at the position of this pair, to the control gate (28).

3 Claims, 4 Drawing Sheets

METHOD OF MAKING LARGE-SCALE EPROM MEMORY WITH A CHECKER BOARD PATTERN AND AN IMPROVED COUPLING FACTOR

BACKGROUND OF THE INVENTION

The invention relates to semiconductor memories and specifically to electrically programmable non-volatile memories, currently called EPROM; in particular, the invention relates to the manufacturing of floating gate memories.

For obtaining large-scale memories, for example memories able to store up to 16 megabits, the size of each cell of the memory has to be reduced as much as possible.

But of course, there is a limitation due to physical problems and in particular to the size of photolithographic patterns; another limitation is due to parasitic electrical parameters associated to the manufacturing process which disturb the memory operation.

An elementary memory point of a conventional memory is shown on FIGS. 1A and 1B, FIG. 1A being an electrical diagram and FIG. 1B being a schematical section view of the elementary memory point.

FIG. 1A shows a transistor T of a floating gate memory point. This transistor comprises a floating gate 1 and a control gate 2, together with two semiconductive regions of a first conductivity type (source 3 and drain 4) separated by a channel region having an opposite conductivity type covered by the floating gate 1 and the control gate 2.

The control gate 2 is connected with a word line LM. The drain 4 is connected with a bit line LB.

For writing such a memory point, the floating gate 1 is charged by injection of hot carriers, by applying to the control gate 2, while a current flows between the source 3 and the drain 4, a sufficiently high potential for having the charge carriers (electrons) trapped into the floating gate. This writing operation causes an increase of the conduction threshold of the transistor which, once written (or programmed), will let current flow only for potential values on its control gate higher than when no programmation has been made.

For reading the information contained in a memory point, a voltage higher than the conduction threshold voltage at the non-programmed state and lower than the conduction threshold voltage at the programmed state is applied to the control gate of the transistor of this memory point. If the transistor lets a current flow when a suitable potential difference is applied between the source and the drain, the memory point is at the non-programmed state. If the transistor does not let a current flow, the memory point is at the programmed state.

The voltage applied to the control gate when the memory point is programmed (programmation potential Vpp) is for example equal to 15 volts. The drain potential Vcc is then for example 10 volts and the source potential Vss is for example zero volt (or the ground).

The voltage applied to the control gate during the reading of the memory point is for example 5 volts. The drain potential Vcc is then for example 1.5 volts, and the source potential is then for example zero volt or the ground.

Referring to FIG. 1B that shows a section view of a memory point designed on a silicon wafer, one can see the floating gate 1 and the control gate 2 of the transistor. The source 3 and the drain 4 are two semiconductive regions of a first conductivity type, for example N+, separated by a channel region 7 of the opposite conductivity type, for example p−.

The floating gate 1 of the transistor is made of a first polysilicon level (poly 1). The floating gate is separated from the substrate by a silicon dioxide layer 5, also called gate oxide layer.

Above the floating gate 1, is a silicon dioxide layer 6. The layer 6 is arranged between the floating gate 1 and the control gate 2, the latter being made of a second polysilicon level (poly 2). The silicon dioxide layer 6 is also called interpoly oxide layer.

In the memory, the control gate 2 of the transistor is connected to a word line LM. The source 3 is connected to the ground and the drain 4 to a bit line LB.

With a conventional memory architecture and the associated programmation mode, the drain of a transistor has to be electrically isolated by thick silicon oxide with respect to the drain of the adjacent transistors of the same word line. If such an isolation is not carried out, it is not possible to program a specific memory point without programming or deprogramming the other ones at the same time.

However, the thick oxide which isolates two adjacent points takes a large surface, mainly when it results from a localized oxidation process (locos).

It has been suggested to replace the localized oxidation by oxide-filled grooves for reducing the total size of the cell, but this technology is not easy to implement industrially.

French patent application 86/12 940, which corresponds with U.S. Pat. No. 4,887,238, has suggested, for reducing the total size of the memory points and therefore increasing the storage capacity of the memory, to use structures wherein the thick oxide layers and the multiple contacts towards the drains or sources are canceled. Those structures are called checker board structures.

FIG. 2 is a top view of nine adjacent memory points in such a checker board structure.

Tij designates the various floating gate transistors making the memory point array, i being a row index and j a column index.

Thus, transistors T11-T13 constitute the first row, transistors T21-T23 the second row, and transistors T31-T33 the third row. Similarly, transistors T11-T31 constitute the first column, transistors T12-T32 the second column and transistors T13-T33 the third column.

The transistor control gates of a same row are interconnected with a same word line, LM1-LM3 for rows 1-3, respectively.

The word lines are conductors (in practice polysilicon) extending through a horizontal direction (row direction).

Each transistor shares with the two adjacent transistors of the same row a diffused region of the first conductivity type which extends according to a column in order to form a bit line, designated by LB1, LB2, LB3 and LB4 for columns 1-4, respectively, and by LBj in a general way. Those lines LBj therefore correspond, at the position of the transistors, either to the source or to the drain.

FIG. 3 shows a section view along line YY' of FIG. 2.

The components are arranged on a substrate 10. The floating gates 11 of the transistors are made by a first polysilicon level (poly 1) and are arranged between two bit lines. The transistor control gates 12 are formed by the portions of the word line LM2 arranged at the position of the transistors. The word lines, and therefore the transistor control gates, are made by a second polysilicon level (poly 2).

A gate oxide layer 13 is arranged under the transistor floating gate.

An oxide layer 14 is arranged between the transistor floating gates. Conventionally, a planarization process is used for having the upper surfaces of this layer 14 and the upper surfaces of the polysilicon level at the same level. This layer 14 is for example made of tetraethyl ortho silicate or TEOS.

An interpoly oxide layer 15 covers the floating gates 11 and the oxide layers 14.

The programmation mode of such an architecture is specific. It is disclosed in the above mentioned French patent application. This is due to the fact that each memory point shares with each of the two adjacent memory points of the same row a region that can be either a source region or a drain region.

Thus, the programmation of a memory point has to take into account the adjacent memory points. This renders the addressing system very complex.

FIG. 4 is a diagram of the capacitors existing at the position of a transistor, for example transistor T22.

If a voltage $V_M$ is applied to the word line LM2, one obtains the voltage $V_F$ on the floating gate 11 by calculating the coupling factor $\gamma$ which associates those two voltages according to the relation:

$$V_F = \gamma V_M$$

and which is determined by the ratio between the capacitor at the level of the interpoly oxide layer and the sum of all the capacitors.

FIG. 4 shows a capacitor $C_{OI}$ at the level of the interpoly oxide layer 15 between the word line LM2 and the floating gate 11. There is also a capacitor $C_{OG}$ at the level of the gate oxide layer 13 between the floating gate 11 and the substrate 10.

The coupling factor $\gamma$ is defined by:

$$\gamma = C_{OI}/(C_{OI} + C_{OG})$$

A value representative of the coupling factor can be calculated by using the usual values for the size of the elements:
 length of the floating gate along the row direction: 0.5 micrometer;
 thickness of the interpoly oxide layer: 20 nm;
 thickness of the gate oxide layer: 20 nm.

The value of the coupling factor is then equal to the ratio between the quantities 0.5/20 and 0.5/20+0.5/20, that is only 0.5.

SUMMARY OF THE INVENTION

The invention provides for a new structure which permits to improve the coupling factor and which uses a conventional addressing system. Moreover, this new structure does not have a thick oxide area, which permits to obtain a reduced size of the memory.

According to the invention, the memory comprises word lines extending along a first direction (row direction), and bit lines extending along a second direction (column direction) wherein each memory point is made by a pair of floating gate MOS transistors, the two transistors of this pair having a common drain region made by a diffusion of the first conductivity type which extends along a column for forming a bit line on a substrate of the second conductivity type, each transistor of a pair has a source region made by a diffusion of the first conductivity type extending along a column arranged on each side, along the row direction, of the common drain region, those source regions being interconnected to a same constant potential and, additionally, wherein a conductive area is connected to the floating gates of the two transistors of each pair and is in register with the word line connected to the memory point made by the pair of transistors and corresponding, at the position of this pair, to the control gate.

BRIEF DISCLOSURE OF THE DRAWINGS

The foregoing and other objects, features and advantages of the invention will be apparent from the following detailed description of preferred embodiments as illustrated in the accompanying drawings wherein.

Generally speaking, as conventional in the field of integrated circuit representation, it will be noted that the various drawings are not drawn to scale either inside one figure or from one figure to the other, and in particular the thicknesses of the various layers are arbitrarily drawn in order to facilitate the legibility of the drawings.

DETAILED DESCRIPTION OF THE INVENTION

Figure 1A:
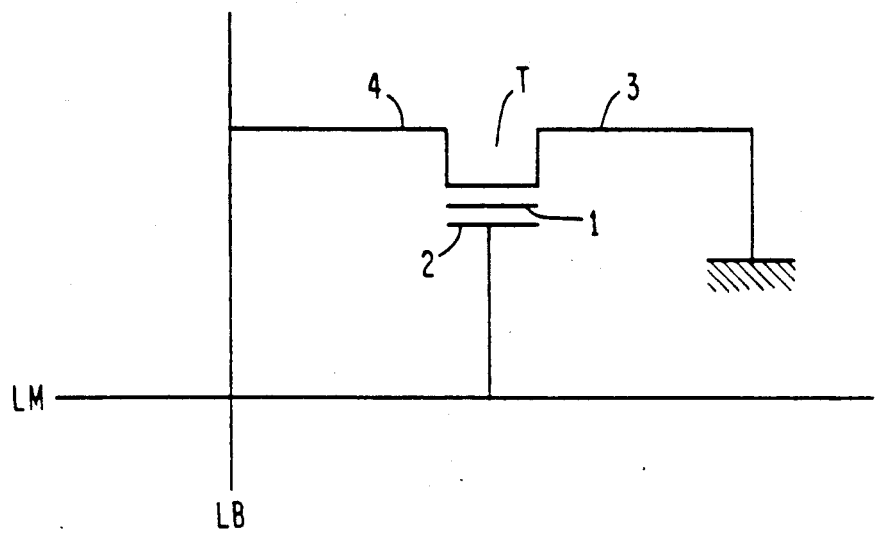
FIGS. 1A and 1B (above disclosed) show an elementary memory point of a conventional memory, FIG. 1A corresponding to an electrical diagram and FIG. 1B to a schematical section view of the elementary memory point.
Figure 1B:
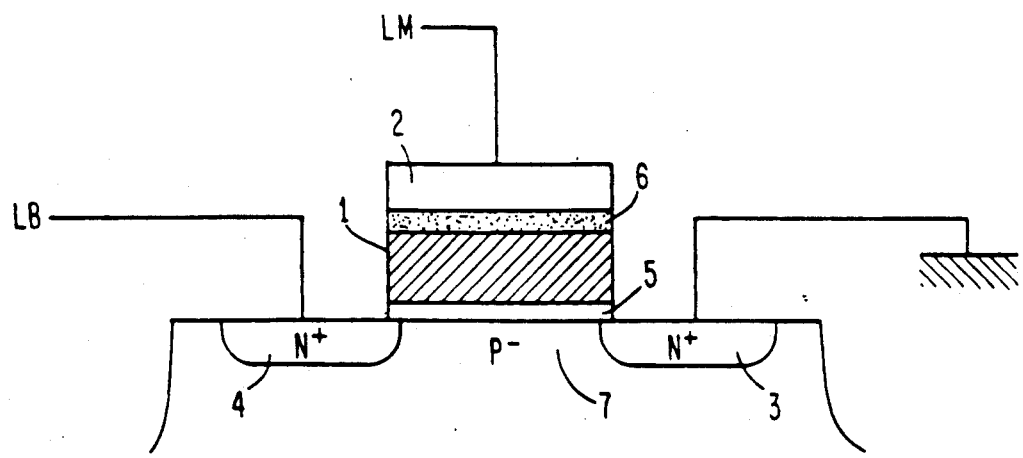
Figure 2:
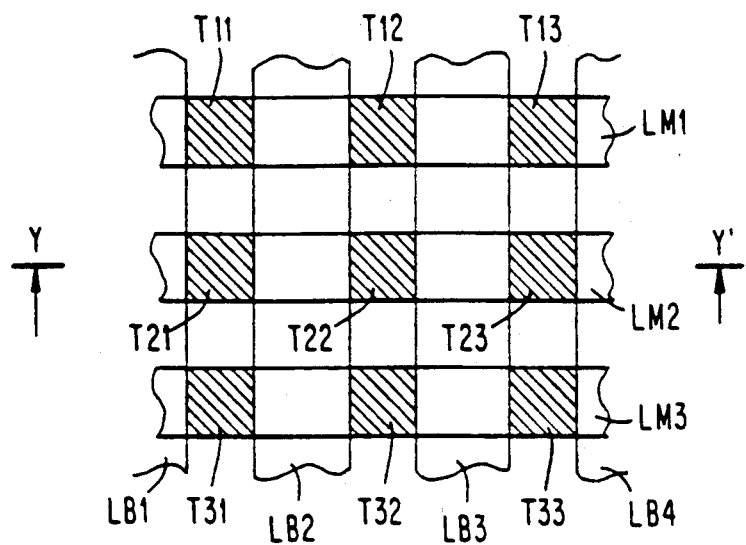
FIG. 2 (above disclosed) is a top view of the design of nine adjacent memory points on a silicon wafer according to a conventional checker board pattern.
Figure 3:
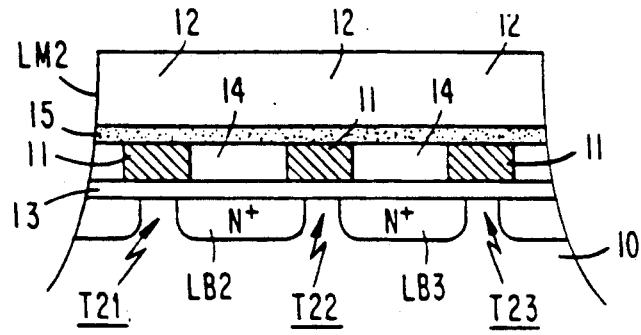
FIG. 3 (above disclosed) is a section view according to line YY' of FIG. 2.
Figure 4:
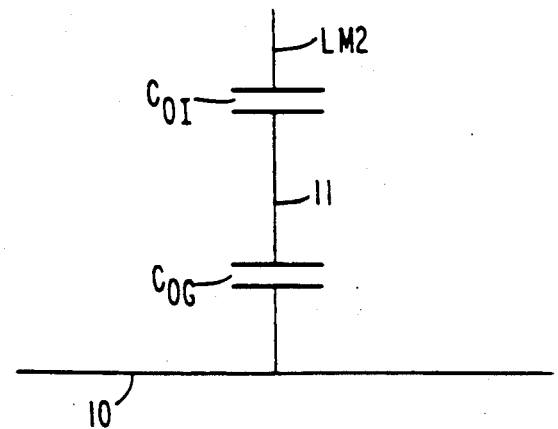
FIG. 4 (above disclosed) is a diagram of the capacitors existing at the position of a transistor in an architecture according to FIG. 2.
Figure 5:
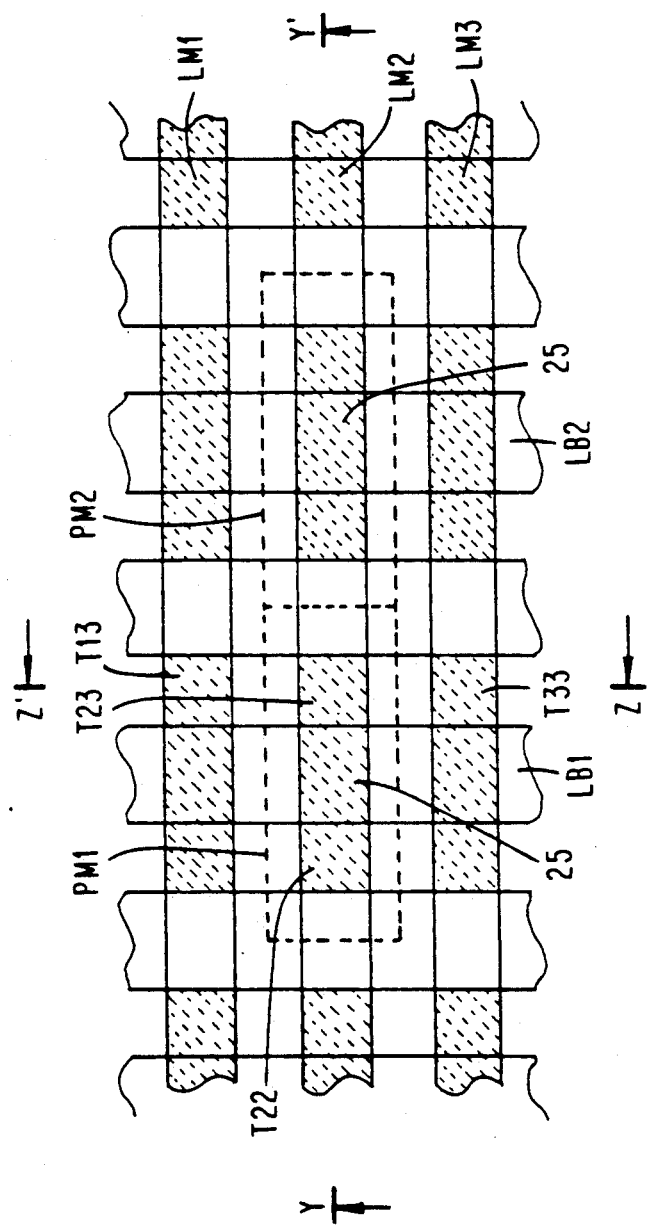
FIG. 5 is a top view of a structure according to the invention.

FIG. 5 is a top view of an embodiment of the structure according to the invention. As in FIG. 2, the transistors are arranged according to an array of rows and columns.

The transistor control gates of row i are again interconnected to word lines LMi.

However, in this structure, each memory point is made by a pair of transistors. Two memory points are for example delineated on the figure by crosshatched lines and designated by PM1 and PM2.

A conductive area 25 is connected to the floating gates of the two transistors of each pair. The bit lines LBj are no longer arranged between each transistor column, but are separated by two transistor columns.

Figure 6:
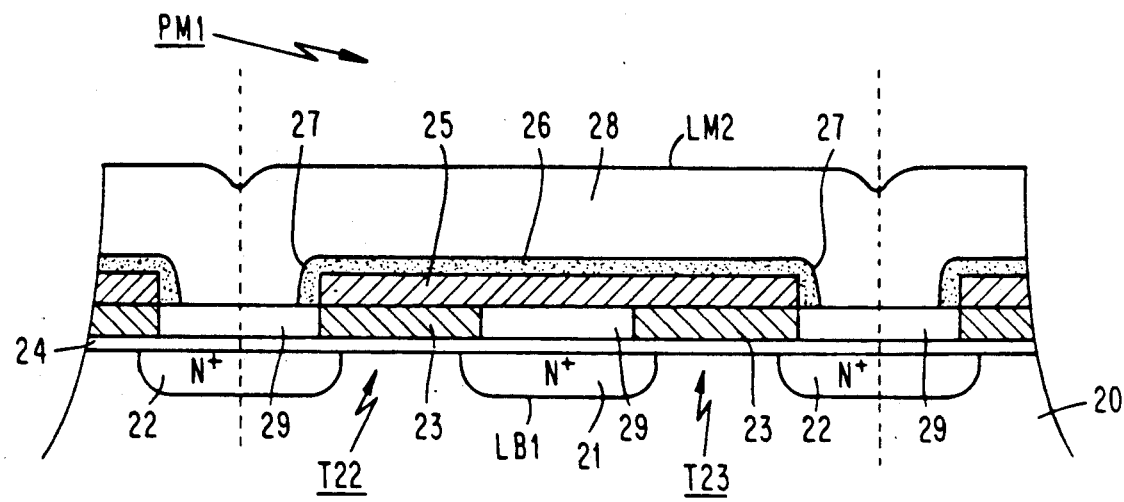
FIG. 6 is a section view according to line YY' of FIG. 5.

FIG. 6 is a cross section of a memory point along line YY' of FIG. 5. This memory point, for example memory point PM1, is also delineated on the figure by cross-hatched lines.

The components are arranged on a substrate 20. Two transistors T22 and 23, which form a pair of transistors constituting a memory point, share a common drain region 21. The common drain region 21 is made by a diffusion of the first conductivity type which extends along a column for forming a bit line LB1.

Each of the two transistors T22 and T23 comprises a source region 22 which is made by a diffusion of the first conductivity type. Those diffusions extend along a column and are arranged on each side, along the row direction, of the common drain region. Each source region is in turn shared with an adjacent memory point transistor of the same row.

The transistor floating gates 23 are made by a first polysilicon level (poly 1). A gate oxide layer 24 is arranged under the transistor floating gates. A conductive area 25 is connected to the floating gates of the two transistors T22 and T23. It is made by a second polysilicon level (poly 2). This conductive area 25 is covered on its upper surface with an interpoly oxide layer 26, and is covered at its both extremities, along the row direction, by an oxide area 27, called corner oxide area.

An oxide layer 29 is arranged between the transistor floating gates. As in the structure of the checker board type, a planarization process is used for having the upper surfaces of layer 29 and the upper surfaces of the first polysilicon level at the same level. Layer 29 is for example made of TEOS.

The word line LM2 covers the whole arrangement. The interpoly oxide layer 26 and the corner oxide areas 27 permit to isolate the conductive area 25 from the word line LM2. The word line LM2 corresponds to the control gate 28 at the position of the memory points.

Figure 7:
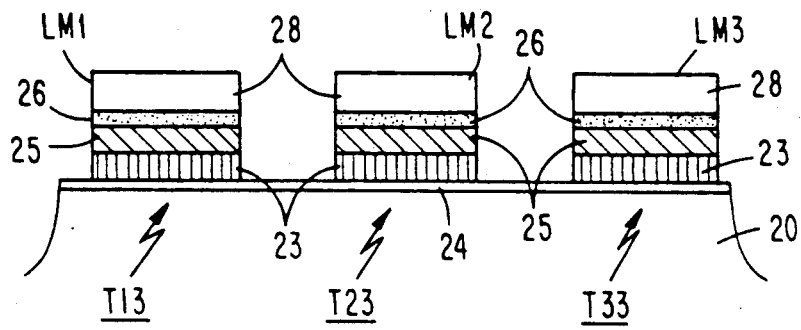
FIG. 7 is a section view according to line ZZ' of FIG. 5.

FIG. 7 is a section view along line ZZ' of FIG. 5. Transistors T13, T23 and T33 are again shown on this figure. Each of the transistors has a floating gate 23 arranged above the gate oxide layer 24. The conductive area 25 is arranged above the floating gates 23 and under the interpoly oxide layer 26. Word lines LM1, LM2 and LM3 are arranged above the interpoly oxide layer 26, corresponding to the control gate 28 at the position of the memory points.

Thus, the memory according to the present invention comprises floating gate MOS transistors arranged according to rows and columns on a substrate of a first conductivity type with each memory point of the memory comprising a pair of transistors arranged according to a row. The memory is manufactured according to a method comprising the steps of depositing and etching a first polysilicon layer on the substrate to form, according to columns, strips in which the floating gates 23 of the transistors will be formed, and implanting a dopant of a second conductivity type in the substrate by using the first polysilicon layer as a mask to form alternate drain 21 and source 22 columns of the transistors. The method includes the further steps of forming isolation strips 29 between the strips of the first polysilicon layer, depositing a second polysilicon layer 25 and isolating its upper surfaces 26, and etching the second polysilicon layer 25 to cover, according to columns, the pairs of adjacent strips from which will be formed the transistor floating gates of a transistor pair. The method includes the further steps of isolating the lateral surfaces 27 of the second polysilicon layer, depositing a third polysilicon layer 28, and etching the three polysilicon layers using the same mask and according to rows. The method further includes the final steps of forming an isolating layer and establishing contacts with remaining strips of the third polysilicon level (word lines), with the drain columns (bit lines) and with the source columns. As set forth above, in a preferred embodiment, the isolation strips 29 between the strips of the first polysilicon layer are made by a planarization process whereby the upper surfaces of the isolation strips and the upper surfaces of the first polysilicon layer are formed at the same level. As also indicated above, the isolation strips may be made of tetraethyl ortho silicate (TEOS).

Figure 8:
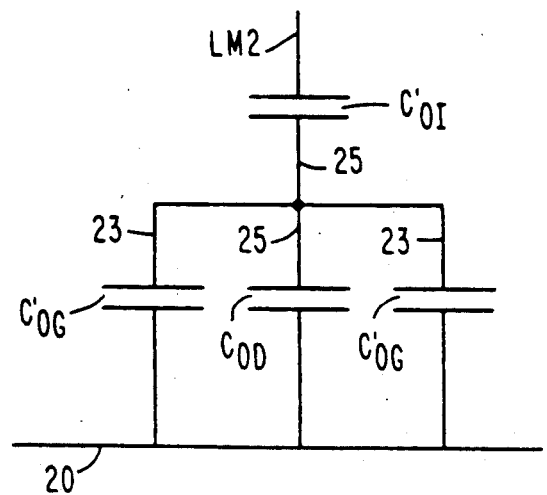
FIG. 8 is a diagram of the capacitors existing at the position of the structure memory point of FIG. 5.

FIG. 8 shows a diagram of the capacitors existing at the position of a memory point of the structure according to the invention. This figure shows the capacitor $C'_{OI}$ at the level of the interpoly oxide layer 26 arranged between the word line LM2 and the conductive area 25. There is also a capacitor $C'_{OG}$ at the level of the gate oxide layer 24 arranged between the floating gates 23 and the substrate 20. There are two capacitors $C'_{OG}$ in a memory point. There is also a capacitor $C_{OD}$ at the level of the TEOS oxide layer separating the floating gates 23.

The coupling factor $\gamma$ is defined by:

$$\gamma = C'_{OI}/(C'_{OI} + C'_{OC} + C_{OD} + C'_{OG}).$$

A value representative of the coupling factor can be calculated by using the usual values for the size of the elements:

length of the floating gate along the row direction: 0.5 micrometer;
length of the TEOS oxide layer along the row direction: 0.6 micrometer;
thickness of the interpoly oxide layer: 20 nm;
thickness of the gate oxide layer: 20 nm;
thickness of the TEOS oxide layer: 200 nm.

The value of the coupling factor is then equal to the ratio between the quantities $(0.5+0.6+0.5)/20$ and $(0.5+0.6+0.5)/20 + 0.5/20 + 0.6(200+20) + 0.5/20$.

The coupling factor is then equal to 0.61.

The structure according to the invention permits to obtain an improved coupling factor.

This structure also presents favorable planarization conditions owing to the absence of the thick oxide area.

Lastly, conductive lines (now shown on the figures) made for example of aluminum are arranged above respective bit lines. These conductive lines are connected with bit lines of other memory blocks, thus permitting to apply the desired voltage to those bit lines and to the drains of the transistors with which the bit lines are connected. In case of a checker board structure, such a conductive line is arranged between each pair of transistor columns. In the structure according to the invention, two transistor columns separate two adjacent conductive lines. The implementation of conductive lines will therefore be more easy in the second case.

I claim:

1. A method for manufacturing a memory comprising floating gate MOS transistors arranged according to rows and columns on a substrate of a first conductivity type, each memory point of the memory comprising a pair of transistors arranged according to a row, said method comprising the following steps:

depositing and etching a first polysilicon layer on the substrate to form, according to columns, strips in which the floating gates (23) of the transistors will be formed, implanting a dopant of a second conductivity type in the substrate by using the first polysilicon layer as a mask to form alternate drawing (21) and source (22) columns of said transistors, forming isolation strips (2a) between the stripes of the first polysilicon layer, depositing a second polysilicon layer (25) and isolating its upper surfaces (26), etching the second polysilicon layer (25) to cover, according to columns, the pairs of adjacent stripes from which will be formed the transistor floating gates of a transistor pair, isolating the lateral surfaces (27) of the second polysilicon layer, depositing a third polysilicon layer (28), etching by a same mask, according to rows, the three polysilicon layers, forming an isolating layer, and establishing contacts with remaining stripes of the third polysilicon level (word lines), with the drain columns (bit lines) and with the source columns.

2. A manufacturing method according to claim 1, wherein the isolation stripes between the stripes of the first polysilicon layer are made by a planarization process and the upper surfaces of said isolation stripes (29) and the upper surfaces of the first polysilicon layer are formed at the same level.

3. A manufacturing method according to claim 2, wherein the isolation stripes are made of tetraethyl ortho silicate (TEOS).

* * * * *